(12) United States Patent
Deml et al.

(10) Patent No.: US 7,236,403 B2
(45) Date of Patent: Jun. 26, 2007

(54) PRECHARGE ARRANGEMENT FOR READ ACCESS FOR INTEGRATED NONVOLATILE MEMORIES

(75) Inventors: Christoph Deml, Munich (DE); Thomas Liebermann, Munich (DE); Edvin Paparisto, Munich (DE); Stephan Rogl, Munich (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 11/005,804

(22) Filed: Dec. 7, 2004

(65) Prior Publication Data
US 2005/0128813 A1 Jun. 16, 2005

(30) Foreign Application Priority Data
Dec. 10, 2003 (DE) .................... 103 57 786

(51) Int. Cl.
*G11C 16/00* (2006.01)

(52) U.S. Cl. .................. 365/185.25; 365/203

(58) Field of Classification Search ............ 365/185.25
See application file for complete search history.

(56) References Cited

U.S. PATENT DOCUMENTS

| | | | | |
|---|---|---|---|---|
| 4,451,905 A | * | 5/1984 | Moyer .................... | 365/185.02 |
| 4,858,194 A | * | 8/1989 | Terada et al. .......... | 365/185.25 |
| 5,465,235 A | * | 11/1995 | Miyamoto ............. | 365/185.25 |
| 5,812,456 A | | 9/1998 | Hull et al. | |
| 6,125,057 A | * | 9/2000 | Loeper ................. | 365/185.21 |

OTHER PUBLICATIONS

German Office Action dated Oct. 7, 2004.

* cited by examiner

*Primary Examiner*—Tan T. Nguyen
(74) *Attorney, Agent, or Firm*—Jenkins, Wilson, Taylor & Hunt, P.A.

(57) ABSTRACT

Precharge arrangement for read access for integrated nonvolatile memories having at least one memory cell (2), at least one source line (8), at least one bit line (9), at least one sense amplifier (3) and at least one precharge potential, the bit line (9) continuously having the precharge potential in a deselected state of the bit line (9), and the source line (8) having a predetermined reference potential, in particular a ground potential (10), in a selected state of the bit line (9).

9 Claims, 2 Drawing Sheets

PRECHARGE ARRANGEMENT FOR READ ACCESS FOR INTEGRATED NONVOLATILE MEMORIES

TECHNICAL FIELD

The invention relates to a precharge arrangement in accordance with the preamble of claim 1 for read access for integrated nonvolatile memories having at least one memory cell, at least one source line, at least one bit line, at least one sense amplifier and a precharge potential.

BACKGROUND ART

In the case of nonvolatile memories (EEPROM, flash, EPROM, OTP, . . . ), one terminal of the memory cell is always at a fixed potential, for example ground potential. This line is the so-called source line. The other terminal of the memory cell is connected to the so-called bit line. The memory cell is read via the bit line.

If the bit line is not active, that is to say if a read-out operation is not being effected, then the bit line, to which a precharge potential is applied from the previous read-out operation, can be discharged via a conductive memory cell since the memory cell is connected by its other terminal to the source line carrying ground potential.

If the bit line is selected, then its parasitic capacitances have to be charged with the precharge potential by the sense amplifier connected to the bit line. This results in a correspondingly long read access time of the memory cell.

A description has been given of performing the so-called charging of the parasitic capacitances of the bit line prior to the read-out thereof by the sense amplifier in the sequence of the read access by means of a specific arrangement, as disclosed in DE 100 53 956 A1.

In this case, what has proved to be disadvantageous is that the operation of precharging the bit line has to be started at a specific point in time prior to the read-out. This means that it is necessary to generate an additional external signal for precharging of the bit line, it being necessary to effect corresponding processing of this signal and synchronization with the read-out operation. The read access is thus divided into two phases, the phase of precharging the bit line disadvantageously taking up a specific time. Fast sense amplifiers are regulating devices which reach their operating point relatively slowly in the case of a large change in potential, thereby resulting in specific time losses.

U.S. Pat. No. 5,812,456 describes an integrated, nonvolatile memory in which the bit line selection is not performed in the customary manner by means of a drain-side selection transistor that charges the selected bit line to a specific precharge voltage. Instead, provision is made of a source-side switching transistor that enables, in the selected state, a current flow via the bit line that is fixedly connected to the evaluation device.

SUMMARY OF THE INVENTION

The object of the present invention is to reduce the read access times in nonvolatile memories, to eliminate the abovementioned disadvantages and to afford further advantages.

This object is achieved in accordance with the characterizing part of claim 1 by virtue of the fact that the bit line continuously has the precharge potential in a deselected state of the bit line, and that the source line has a predetermined reference potential, in particular a ground potential, in a selected state of the bit line.

Advantageous refinements and developments of the invention are presented in the subclaims.

In a first embodiment according to the invention, in a minimal configuration, it is provided that the bit line is directly connected to the sense amplifier and thus still continuously has the precharge potential thereof applied to it. For this purpose, the source line is isolated from the ground potential via a ground switching element as long as the bit line is not selected, that is to say the source line is "floating". This advantageously prevents the bit line from being discharged in the case of a conductive memory cell.

In a further embodiment, it is provided that the bit line is connected to a precharge potential via a first controllable switching element. In an advantageous manner, the source line is also connected to the precharge potential by means of a second controllable switching element. The latter has the advantage that there is no need to effect any charge reversal operations from the bit line to the source line via a conductive memory cell. A third controllable switching element is inserted between the source line and the ground potential. These three controllable switching elements are preferably transistors whose control inputs are connected to one another and are at a potential that is present at the output of an inverter in a manner dependent on the address selection signal present at the input of the inverter.

The switching elements are formed in such a way that, in the case of a non-selected, that is to say deselected, bit line, the first and second switching elements for the bit line and for the source line are in the conductive state, at the same time the third switching element being nonconductive in this deselected state of the bit line. This is advantageously achieved by virtue of the fact that the first and second switching elements are p-conducting transistors, for example, and the third switching element is an n-conducting transistor. These transistors may advantageously be formed as MOSFET types.

This precharge arrangement has the advantage that it does not require an external precharge signal. At the same time, any signal processing steps for such a signal are advantageously obviated. Furthermore, it is advantageous that the precharge arrangement according to the invention is realized with a very small number of components which, in a preferred embodiment, can be concomitantly introduced simultaneously on the memory chip.

It is furthermore advantageous that the voltage of the precharge potential that is continuously applied to the bit line and the source line during the deselected state of the bit line has the same magnitude as the operating voltage of the sense amplifier. Consequently, there are advantageously no time losses during the read access of the sense amplifier since, on the one hand, the latter no longer has to charge any parasitic capacitances and, on the other hand, the bit line is already at the operating voltage of the sense amplifier.

If the bit line is selected, then the source line is rapidly switched to the ground potential by the third switching element without regulation and the source line and the bit line are isolated from the precharge potential via the first and second switching elements.

This affords the advantage that the operating point is reached significantly more rapidly and the access time decreases. This is of great significance owing to the rising clock frequency and smaller feature size and thus larger time constants in the future.

Further details of the invention are described in the drawing on the basis of a schematically illustrated exemplary embodiment.

BRIEF DESCRIPTION OF THE DRAWINGS

In this case.

DETAILED DESCRIPTION OF THE INVENTION

Identical elements having identical functions are provided with the same reference symbols.

Figure 1:
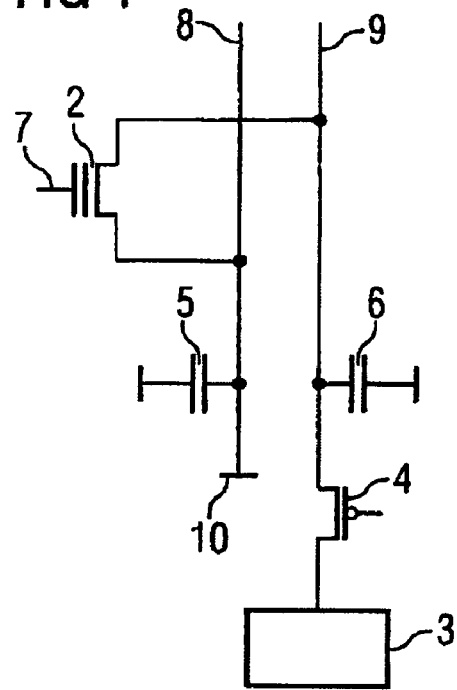
FIG. 1 shows an example of a read access arrangement according to the prior art.

FIG. 1 schematically illustrates a read access arrangement according to the prior art. One terminal of the memory cell 2 is connected to a source line 8, and a further terminal is connected to a bit line 9. The parallel illustration of the source line 8 and the bit line 9 is purely schematic. In practice, these lines may be arranged in different ways.

The source line 8 is connected to a fixed ground potential 10 by one of its ends. The bit line 9 is coupled to a sense amplifier 3 via an address switching element 4.

Parasitic capacitances of the lines 8, 9 are respectively illustrated as a parasitic capacitance 5 of the source line 8 and as a parasitic capacitance 6 of the bit line 9.

If the memory cell 2 is conductive, then it connects the bit line 9 to the ground potential 10 via the source line 8, the bit line 9 with its parasitic capacitance 6 being discharged, that is to say assuming ground potential 10.

In the event of the bit line 9 being selected, the address switching element 4 has a signal applied to its control input and connects the sense amplifier 3 to the bit line 9. Before the actual read operation, the sense amplifier 3 charges the bit line 9 with a precharge potential as a first partial step of the read operation. This operation requires a specific time since the sense amplifier 3 is a regulating device, in principle. The read-out operation is effected in a second partial step.

Figure 2:
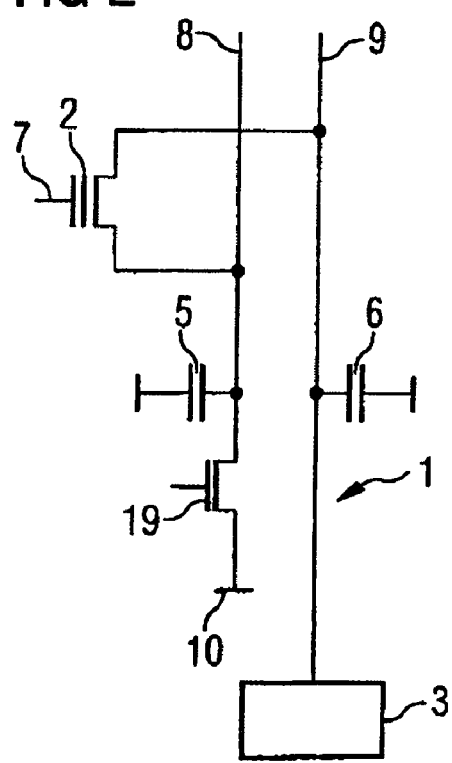
FIG. 2 shows a first example of a precharge arrangement according to the invention for a read access arrangement.

FIG. 2 illustrates a first exemplary embodiment of a precharge arrangement 1 according to the invention for a read access. In this case, the sense amplifier 3 is directly connected to the bit line 9. The precharge potential is thus continuously applied to said bit line in a deselected state of the bit line. The source line 8 is connected to the ground potential 10 via a ground switching element 19, the ground switching element 19 being activated only during the read-out operation. In the deselected state of the bit line 9, the source line 8 is in the so-called "floating" state. Consequently, in the case of a conductive memory cell 2, the bit line 9 in the deselected state is not connected to the ground potential 10 and advantageously cannot be discharged. The ground switching element 19 is preferably an n-conducting transistor.

Figure 3:
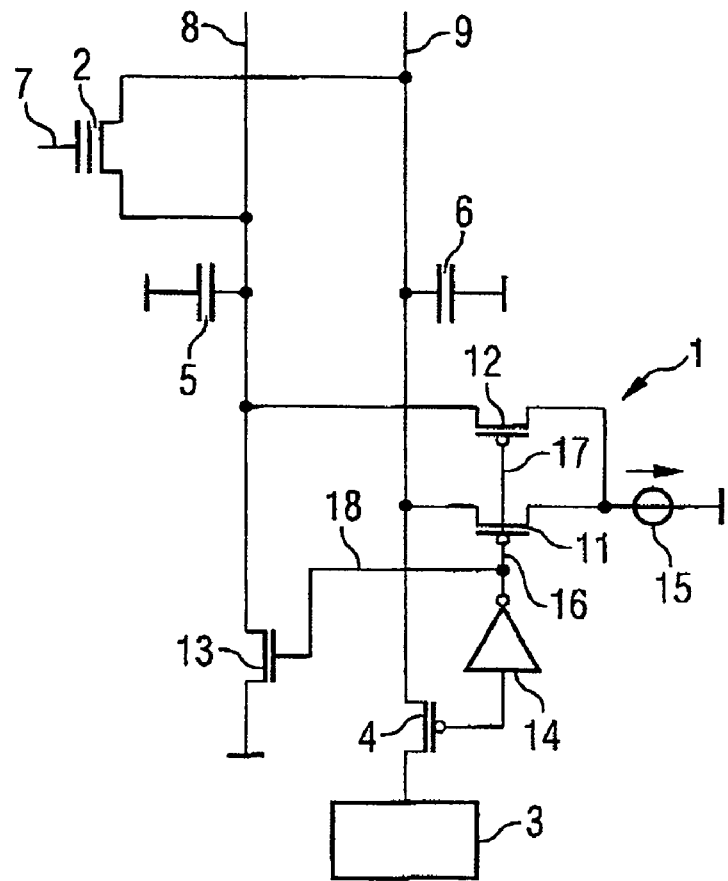
FIG. 3 shows a second example of a precharge arrangement according to the invention for a read access arrangement.

FIG. 3 shows a further exemplary embodiment of a precharge arrangement 1 according to the invention for a read access.

The bit line 9 can be connected to a precharge potential source 15 via a first controllable switching element 11 having a control input 16. The source line 8 can likewise be connected to the precharge potential of the precharge potential source 15 via a second controllable switching element 12 having a control input 17.

A third controllable switching element 13 having a control input 18 is inserted between the source line 8 and the ground potential 10.

The control inputs 16, 17, 18 of the respective switching elements 11, 12, 13 are connected to one another and are at the same potential. They are furthermore connected to the output of an inverter 14, the input of which is connected to the control input of the address switching element 4.

If the bit line 9 is not selected, that is to say is deselected, then a potential corresponding to the deselected state is applied to the control input of the address switching element 4. The inverter 14 then carries a correspondingly inverted potential at its output, which potential is simultaneously present at the control inputs 16, 17, 18 of the switching elements 11, 12, 13. The switching elements 11, 12, 13 are formed in such a way that, on the one hand, in this deselected state, the first and second switching elements 11, 12 conduct and connect the source line 8 and the bit line 9 respectively to the precharge potential source 15, and, on the other hand, the third switching element 13 does not conduct and thus isolates the source line 8 from the ground potential 10. In the exemplary embodiment shown, the first and the second switching element 11, 12 is formed as a p-conducting transistor and the third switching element 13 is formed as an n-conducting transistor.

Consequently, the source line 8 and the bit line 9 continuously carry the precharge potential of the precharge potential source 15 in the deselected state of the bit line 9, so that a signal for precharging and the processing thereof are advantageously obviated.

It is advantageous that the source line 8 is also connected to the precharge potential of the precharge potential source 15 in the deselected state of the bit line 9 since this avoids charge reversal operations from the bit line 9 to the source line 8 through a conductive memory cell 2.

If the bit line 9 is selected, then the control input of the address switching element 4 has applied to it a potential which corresponds to the selected state and activates the address switching element 4. The control inputs 16, 17, 18 of the switching elements 11, 12, 13 receive a correspondingly inverted potential via the inverter 14, the first and second switching elements 11, 12 no longer conducting. The third switching element 13 conducts and connects the source line 8 to ground potential 10. The source line 8 is thus connected rapidly to the ground potential 10 without regulation, a specific time constant being crucial. The now conductive address switching element 4 connects the precharged bit line 9 to the sense amplifier 3, which no longer has to charge the bit line 9.

Figure 4:
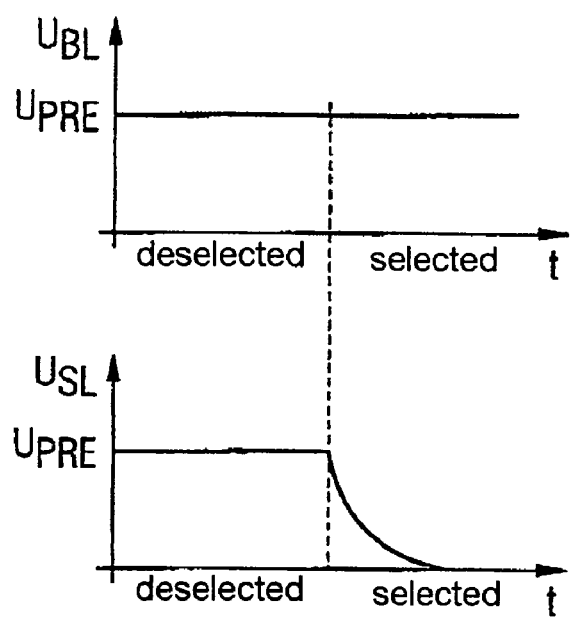
FIG. 4 shows two graphs of voltage states of the bit line and source line as a function of time.

FIG. 4 in each case shows the voltage state against time in the deselected and selected states of the bit line 9. The upper diagram illustrates the voltage state UBL of the bit line 9, which is continuously at the voltage UPRE of the precharge potential source 15 in the deselected time interval. Furthermore, the upper diagram likewise illustrates part of the selected time interval. In this case, the magnitude of the voltage UPRE of the precharge potential source 15 is advantageously of the same magnitude as the operating voltage of the sense amplifier 3.

The lower diagram of FIG. 4 illustrates the voltage state of the voltage USL of the source line 8 and likewise divides it into the time intervals "deselected" and "selected" in a manner corresponding to the upper diagram. In the deselected time interval, the voltage USL of the source line 8 and the voltage UPRE corresponds to that of the precharge potential source 15, while it assumes the ground potential 10 in the selected region.

The bit line 9 and the source line 8 are thus continuously precharged with the precharge potential of the precharge potential source 15 in the deselected state of the bit line 9, thereby advantageously resulting in a shortened read access time since, on the one hand, the sense amplifier 3 reaches its operating point very rapidly and precharge signals and the processing thereof are at the same time obviated. The further advantage is that the access time decreases correspondingly. This is of great significance for the future owing to rising clock frequencies and smaller feature sizes and thus larger time constants.

Although the present invention has been described above on the basis of two preferred exemplary embodiments, it is not restricted thereto, but rather can be modified in diverse ways.

Thus, by way of example, the ground potential 10 may be a fixed preset reference potential. Furthermore, the switching elements 11, 12, 13, 19 may be formed as MOFSET transistors.

Furthermore, alternatives that are not illustrated in accordance with FIG. 4 are possible, which will be described briefly:

In a first alternative, the source line 8 is connected to the ground potential 10 via the third switching element 13, the source line 8 simultaneously being connected to the precharge potential of the precharge potential source 15 via the second switching element 12 in the deselected state of the bit line 9. The first switching element 11 is obviated.

In a second alternative, the source line 8 is also connected to the ground potential via the third switching element 13, the bit line 9 being connected to the precharge potential of the precharge potential source 15 via the first switching element 11 in the deselected state of the bit line 9. The second switching element 12 is obviated in this case.

LIST OF REFERENCE SYMBOLS

1 Precharge arrangement
2 Memory cell
3 Sense amplifier
4 Address switching element
5 Parasitic capacitance of the source line
6 Parasitic capacitance of the bit line
7 Word line
8 Source line
9 Bit line
10 Ground potential
11 First controllable switching element
12 Second controllable switching element
13 Third controllable switching element
14 Inverter
15 Precharge potential source
16, 17, 18 Control inputs
19 Ground switching element
UBL Voltage of bit line
USL Voltage of source line
UPRE Voltage of precharge potential
T Time

What is claimed is:

1. Precharge arrangement for read access for integrated nonvolatile memories having at least one memory cell, at least one source line, at least one bit line, at least one sense amplifier and at least one precharge potential, wherein the bit line continuously has the precharge potential in a deselected state of the bit line, and wherein the source line has a predetermined reference potential, in particular a ground potential, in a selected state of the bit line, and further wherein the source line of the memory cell is formed such that the source line is electrically connectable to the ground potential via a ground switching element, the sense amplifier being directly connected to the bit line.

2. Precharge arrangement according to claim 1, wherein the ground switching element is formed as an n conduction type transistor.

3. Precharge arrangement according to claim 2, wherein at least one of the transistors is formed as a MOSFET.

4. Precharge arrangement for read access for integrated nonvolatile memories having at least one memory cell, at least one source line, at least one bit line, at least one sense amplifier and at least one precharge potential, wherein the bit line continuously has the precharge potential in a deselected state of the bit line, and wherein the source line has a predetermined reference potential, in particular a ground potential, in a selected state of the bit line, further wherein the bit line and the source line continuously have a precharge potential in the deselected state of the bit line, and further wherein the source line of the memory cell is formed such that the source line is connectable to a precharge potential of a precharge potential source via a controllable switching element and is formed such that the source line is electrically connectable to the ground potential via a further controllable switching element, the sense amplifier being directly connected to the bit line.

5. Precharge arrangement according to claim 4, wherein the first and the second controllable switching element is formed as a transistor of a first conduction type and the third controllable switching element is formed as a transistor of a second conduction type.

6. Precharge arrangement according to claim 4, wherein the magnitude of the voltage which is switched onto the bit line through the connection of the bit line to the precharge potential of the precharge potential source via the controllable conductive switching element corresponds to the magnitude of the operating voltage of the sense amplifier.

7. Precharge arrangement for read access for integrated nonvolatile memories having at least one memory cell, at least one source line, at least one bit line, at least one sense amplifier and at least one precharge potential, wherein the bit line continuously has the precharge potential in a deselected state of the bit line, and wherein the source line has a predetermined reference potential, in particular a ground potential, in a selected state of the bit line, and further wherein the bit line of the memory cell is formed such that the bit line is connectable to a precharge potential of a precharge potential source via a first controllable switching element, and wherein the source line of the memory cell is formed such that the source line is electrically connectable to the ground potential via a third controllable switching element, the sense amplifier being connected to the bit line via an address switching element.

8. Precharge arrangement according to claim 7 wherein the first controllable switching element, the second controllable switching element and the third controllable switching element in each case have a control input, said control inputs being connected to one another and to the output of an inverter, the input of which is connected to the control input of the address switching element.

9. Precharge arrangement for read access for integrated nonvolatile memories having at least one memory cell, at least one source line, at least one bit line, at least one sense amplifier and at least one precharge potential, wherein the bit line continuously has the precharge potential in a deselected state of the bit line, and wherein the source line has a predetermined reference potential, in particular a ground potential, in a selected state of the bit line, further wherein the bit line and the source line continuously have a precharge potential in the deselected state of the bit line, and further wherein the bit line of the memory cell is formed such that the bit line is connectable to a precharge potential of a precharge potential source via a first controllable switching element, and wherein the source line of a memory cell is formed such that the source line is electrically connectable to the precharge potential of the precharge potential source via a second controllable switching element and to the ground potential via a third controllable switching element, the sense amplifier being connected to the bit line via an address switching element.

* * * * *